US008476092B2

(12) United States Patent
Lee

(10) Patent No.: US 8,476,092 B2
(45) Date of Patent: Jul. 2, 2013

(54) FABRICATING METHOD OF A THIN FILM TRANSISTOR SUBSTRATE FOR LIQUID CRYSTAL DISPLAY DEVICE OF MINIMIZING DEFECTS DUE TO STATIC ELECTRICITY

(75) Inventor: Young-Hun Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 377 days.

(21) Appl. No.: 12/697,962

(22) Filed: Feb. 1, 2010

(65) Prior Publication Data
US 2010/0136719 A1    Jun. 3, 2010

Related U.S. Application Data

(62) Division of application No. 11/770,508, filed on Jun. 28, 2007, now Pat. No. 7,683,387.

(30) Foreign Application Priority Data

Dec. 22, 2006 (KR) ........................ 10-2006-0133139

(51) Int. Cl.
| H01L 21/00 | (2006.01) |
| H01L 29/18 | (2006.01) |
| H01L 33/00 | (2010.01) |
| H01L 23/52 | (2006.01) |

(52) U.S. Cl.
USPC ......... 438/34; 257/207; 257/88; 257/E33.066

(58) Field of Classification Search
USPC .............. 257/78, 88, 202, 204, 207, E33.044, 257/E33.062, 59, 72, 258, 291, 443, E33.066; 438/34
See application file for complete search history.

(56) References Cited

U.S. PATENT DOCUMENTS
| 6,570,161 B2 | 5/2003 | You et al. |
| 2004/0012028 A1 * | 1/2004 | Park et al. ........................ 257/88 |

FOREIGN PATENT DOCUMENTS
KR    10-0488156 B1    5/2005

* cited by examiner

*Primary Examiner* — Phat X Cao
*Assistant Examiner* — Diana C Vieira
(74) *Attorney, Agent, or Firm* — Birch, Stewart, Kolasch & Birch, LLP

(57) ABSTRACT

According to an embodiment, there is provided a fabricating method for a thin film transistor substrate divided into a display area displaying images and a non-display area beside the display area, the fabricating method comprising: forming a gate wire in the display area, a common voltage line for a MPS (mass production system) test in the non-display area, and a grounding line for the MPS test in the non-display area with same material at the same time; forming a gate insulating layer covering the gate wire and a first insulating layer covering the common voltage line for the MPS test and the grounding line for the MPS test with same material at the same time; forming a data wire crossing the gate wire and defining a pixel area in the display area; and forming a pixel electrode in the pixel area and an electrode layer on the first insulating layer corresponding to the common voltage line for the MPS test and the grounding line for the MPS test with same material at the same time.

7 Claims, 3 Drawing Sheets

FABRICATING METHOD OF A THIN FILM TRANSISTOR SUBSTRATE FOR LIQUID CRYSTAL DISPLAY DEVICE OF MINIMIZING DEFECTS DUE TO STATIC ELECTRICITY

CROSS-REFERENCE TO RELATED APPLICATIONS

This application claims the benefit of, and is a divisional of, U.S. application Ser. No. 11/770,508, filed on Jun. 28, 2007, now U.S. Pat. No. 7,683,387, which claims priority from Korean Patent Application No. 2006-133139, filed on Dec. 22, 2006 in Republic of Korea. The entire contents of each of these applications are incorporated herein by reference.

BACKGROUND OF THE INVENTION

1. Field of the Invention

The present invention relates to a thin film transistor substrate applied to a liquid crystal display device and a fabricating method thereof, and more particularly, to the thin film transistor substrate and a fabricating method thereof minimizing defects due to static electricity.

2. Description of the Related Art

Recently, a flat panel display device such as a liquid crystal display device, a plasma display panel, an organic light emitting diode, and an electrophoretic indication display has been developed to substitute for a CRT (cathode ray tube).

Generally, the flat panel display device comprises a display panel, and the display panel comprises the thin film transistor substrate 5 a thin film transistor formed on. As shown in FIG. 1, the thin film transistor substrate 5 is fabricated by steps of dividing a mother substrate 1 into a substrate area (a) and a peripheral area (b), forming a lot of layers on the substrate area (a) and patterning each layer into a specific shape, and cutting the mother substrate 1 in each substrate area (a).

A test process is carried out to test whether a defect occurs or not on the wire or layer of the substrate area (a) before dividing the mother substrate 1 into each substrate area (a). Among the test process, testing whether defects occur or not when a voltage applied to the wire or layer and the thin film transistor driven may be an MPS (mass production system) test. Electric defects are checked through the MPS (mass production system) test.

The following is an illustration of the MPS (mass production system) test referring to FIG. 1.

A lot of testing wires 15, 25, 35, 45, 55, 65 are provided on the peripheral area (b) for the MPS (mass production system) test. A lot of testing wires 15, 25, 35, 45, 55, 65 comprise a first test line 15 connected to an odd number gate wire (not shown), a second test line 25 connected to an even number gate wire (not shown), a fifth test line 55 connected to an odd number data wire (not shown), a sixth test line 65 connected to an even number data wire (not shown), a third test line 35 for testing whether a voltage is applied to the common voltage line (not shown) or not, and a fourth test line 45 for testing a short between substrate areas (a). The third test line 35 is connected to the common voltage line (not shown) and the fourth test line 45 is connecting between substrate areas (a). The thin film transistor substrate 5 shown in FIG. 1 is a dual gate type that a gate pad is provided on both sides of the substrate.

Each testing wire 15, 25, 35, 45, 55, 65 is connected to each pad 10, 20, 30, 40, 50, 60. The thin film transistor substrate 5 is tested whether electric defects occurs or not on the thin film transistor substrate 5 by applying a voltage to each pad 10, 20, 30, 40, 50, 60. After finishing the MPS (mass production system) test, the mother substrate 1 divided into each substrate area (a).

As described above, a lot of testing wires 15, 25, 35, 45, 55, 65 are provided on the thin film transistor substrate 5 complicatedly before dividing the mother substrate 1 into each substrate area (a). Thus, Static electricity occurred on the thin film transistor substrate 5 may go to each passage such as testing wires 15, 25, 35, 45, 55, 65, thereby minimizing defects due to static electricity.

However, there is no passage for static electricity that have occurred on the thin film transistor substrate 5 to go to because testing wires 15, 25, 35, 45, 55, 65 are cut when the mother substrate 1 is divided into each substrate areas (a). Thus, defects such as a short among the gate wire (not shown), the data wire (not shown), and the common voltage line (not shown) may occur. Even though static electricity prevention circuit is provided so as to prevent defects due to static electricity on the thin film transistor 5, static electricity prevention circuit is not enough for preventing defects due to static electricity because there is a lot of ways static electricity may be introduced. For example, while moving the thin film transistor film 5, the static electricity may be introduced into the thin film transistor film 5.

SUMMARY OF THE INVENTION

Accordingly, it is an aspect of the present invention to provide a thin film transistor substrate and a fabricating method thereof minimizing defects due to static electricity.

Additional aspects and/or advantages of the present invention will be set forth in part in the description which follows and, in part, will be obvious from the description, or may be learned by practice of the present invention.

The foregoing and/or other aspects of the present invention are also achieved according to an embodiment by providing a thin film transistor substrate divided into a display area displaying the image and a non-display area besides the display area, the thin film transistor substrate comprising: a common voltage line for MPS (mass production system) test and a grounding line for MPS (mass production system) test formed at the edge of the non-display area in parallel; an insulating layer covering the common voltage line for MPS (mass production system) test and the grounding line for MPS (mass production system) test; an electrode layer formed on the insulating layer corresponded to the common voltage line for MPS (mass production system) test and the grounding line for MPS (mass production system) test.

According to an aspect of the present invention, the electrode layer comprises ITO (indium tin oxide) or IZO (indium zinc oxide).

According to an aspect of the present invention, the insulating layer comprises a first insulating layer and a second insulating layer formed on the first insulating layer, the first insulating layer comprises inorganic materials and the second insulating layer comprises organic materials.

According to an aspect of the present invention, the thin film transistor substrate further comprises a gate wire and a data wire crossed each other and defined a pixel area, and formed at the display area, the common voltage line for MPS (mass production system) test and the grounding line for MPS (mass production system) test are formed in a same material with the gate wire at the same time.

According to an aspect of the present invention, the thin film transistor substrate further comprises a gate insulating layer covering the gate wire and a passivation layer covering the data wire, the first insulating layer is formed in the same material with the gate insulating layer at the same time and the second insulating layer is formed in the same material with the passivation layer at the same time.

According to an aspect of the present invention, the thin film transistor substrate further comprises a pixel electrode covering the passivation layer at the pixel area, the electrode layer is formed in the same material with the pixel electrode at the same time.

The foregoing and/or other aspects of the present invention are also achieved, in part, by providing a fabricating method for a thin film transistor substrate divided into a display area displaying images and a non-display beside the display area, the fabricating method comprising: forming a gate wire in the display area, a common voltage line for a MPS (mass production system) test in the non-display area, and a grounding line for the MPS test in the non-display area with same material at the same time; forming a gate insulating layer covering the gate wire and a first insulating layer covering the common voltage line for the MPS test and the grounding line for the MPS test with same material at the same time; forming a data wire crossing the gate wire and defining a pixel area in the display area; and forming a pixel electrode in the pixel area and an electrode layer on the first insulating layer corresponding to the common voltage line for the MPS test and the grounding line for the MPS test with same material at the same time.

According to an aspect of the present invention, the electrode layer comprises ITO (indium tin oxide) or IZO (indium zinc oxide).

According to an aspect of the present invention, the method further comprises steps of forming the passivation layer covering the data wire and a second insulating layer covering the first insulating layer in the non-display area with same material at the same time.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
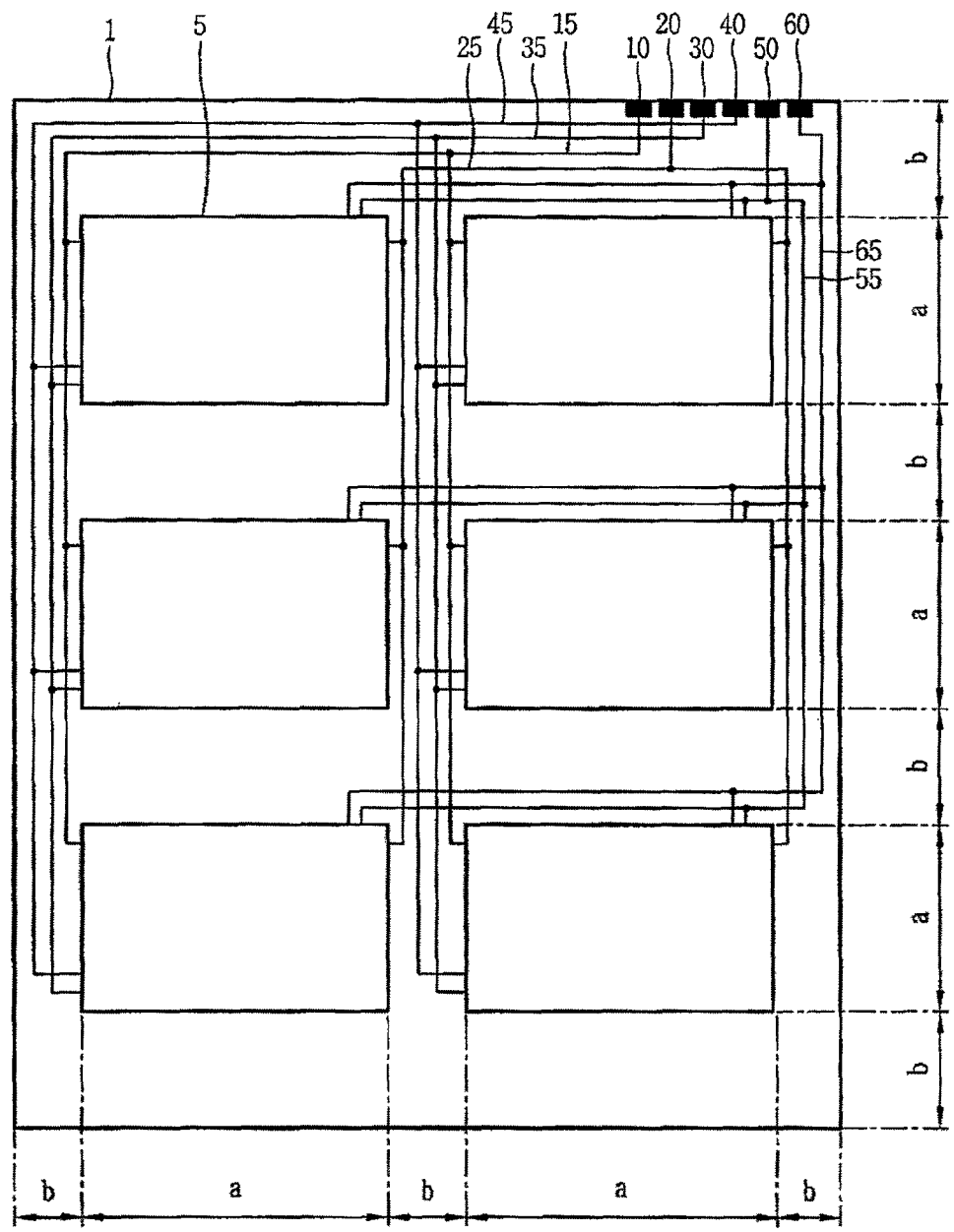
FIG. 1 is a schematic view illustrating MPS (mass production system) test on a thin film transistor substrate according to the related art.

Reference will now be made in detail to the embodiments of the present invention, examples of which are illustrated in the accompanying drawings, wherein like reference numerals refer to like elements throughout.

Figure 2:
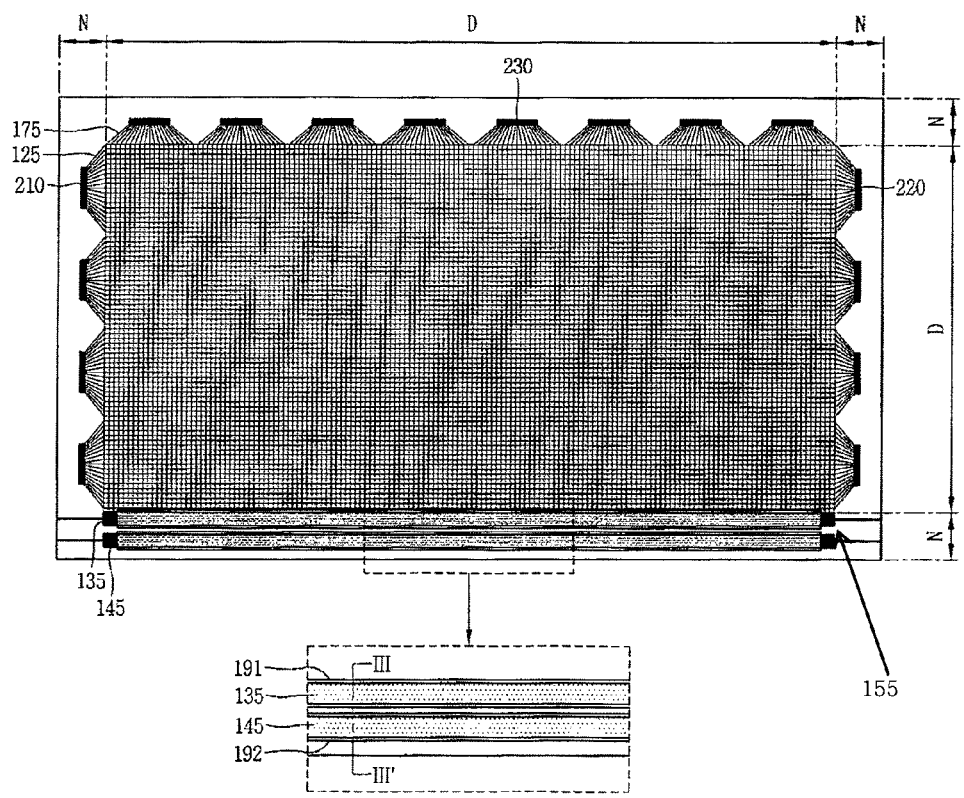
FIG. 2 is a schematic view illustrating the structure of a thin film transistor substrate according to the present invention.
Figure 3:
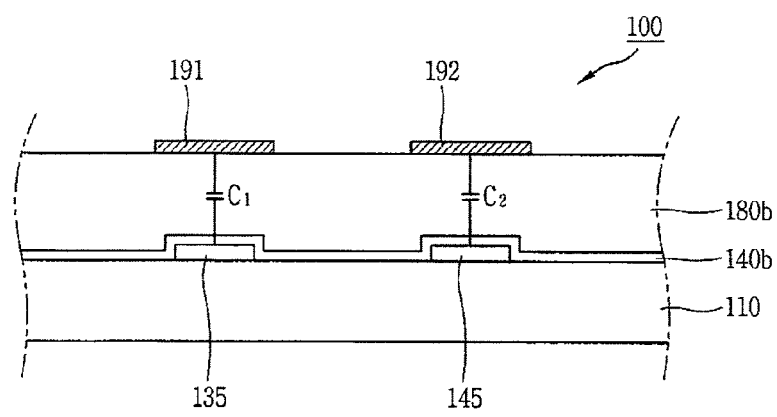
FIG. 3 is a sectional view of a thin film transistor substrate along in FIG. 2.

The Following is an illustration of the thin film transistor substrate according to the present invention referring to FIG. 2 and FIG. 3.

FIG. 2 is a schematic view illustrating the structure of a thin film transistor substrate according to the present invention, and FIG. 3 is a sectional view of a thin film transistor substrate along III-III in FIG. 2.

Generally, as shown in FIG. 2, the thin film transistor substrate 100 is divided into a display area displaying the image and a non-display besides the display area.

First of all, the display area (D) is illustrated in the following with referring to FIG. 3 and FIG. 4C.

A lot of gate wires 125 extended in horizontal, a lot of data wires 170 crossed to the gate wire 125 and defined a pixel area, a thin film transistor (T) formed on intersection, and a pixel electrode 190 formed in the pixel area and connected to the thin film transistor (T) are provided on the display area (D). The thin film transistor (T) comprises a gate electrode that is a part of the gate wire 125, a semiconductor layer 150, an ohmic contact layer 160, a source electrode 171, and a drain electrode 172. The gate wire 125 is covered with a gate insulating layer 140a. A passivation layer 180a is formed on the source electrode 171, the drain electrode 172, and the semiconductor layer 150 that is not covered with the source electrode 171 and the drain electrode 172. The pixel electrode 190 is connected to the drain electrode 172 through the drain contact hole 181.

Next, the non-display area (N) is illustrated in the following with reference to FIG. 2.

On the non-display area, a first gate driving chip 210 is provided on the side of the gate wire 125 and a second gate driving chip 220 is provided on the other side of the gate wire 125. Above described structure is a dual gate type for realizing high resolution, as the display device is bigger. The dual gate type is that the odd number gate wire 125 is connected to the first driving chip 210 disposed on the side and the even number gate wire 125 is connected the second driving chip 220 disposed on the other side. The odd number gate wire 125 is supplied with a gate signal from the first gate driving chip 210, and the even number gate wire 125 is supplied with the gate signal from the second gate driving chip 220.

A bump (not shown) of the first gate driving chip 210 and the second gate driving chip 220 is connected to each pad (not shown) of the gate wire 125. A lot of the gate wires 125 are formed into a gate pan out type that the distance between the gate wires 125 becomes narrow for connecting to each bump (not shown) of the first gate driving chip 210 and the second gate driving chip 220. In other words, a lot of gate wires 125 are provided converged.

A data driving chip 230 is provided on the side of the data wire 170. The data wire 170 is extended from the display area (D) to the non-display area (N). A lot of the data wires 170 are formed into a data pan out type that the distance between the data wires 170 becomes narrow for connecting to each bump (not shown) of the data driving chip 230. The data driving chip 230 supplies a data signal to the data wire 170.

The gate driving chip 210, 220 and the data driving chip 230 are provided on the insulating substrate 110 in a COG (chip on glass) type. However, the gate driving chip 210, 220 and the data driving chip 230 may be provided in a TCP (tape carrier package) type or COF (chip on film) type.

The other end of the data wire 170, not described in detail, is connected to a static electricity preventing circuit 155. The static electricity preventing circuit 155 prevents static electricity occurred on the outskirt of the thin film transistor substrate 100 to flow into the display area (D). The static electricity preventing circuit 155 comprises at least one of a switching device for protecting ESD (electrostatic discharge).

The common voltage line for MPS (mass production system) 135 and the grounding line for MPS (mass production system) 145 are provided on the non-display area (N) in the outskirts of the static electricity preventing circuit in parallel. In other word, the common voltage line for MPS (mass production system) 135 and the grounding line for MPS (mass production system) 145 are provided on the one side in the edge of the insulating substrate 110.

The common voltage line for MPS (mass production system) 135 is a wire for testing whether the common voltage is applied to the common line (not shown) or not. The common line (not shown) in the display area (D) is connected to the common voltage line for MPS (mass production system) 135 through the LOG (line on glass) line (not shown). The common voltage line for MPS (mass production system) 135 is used as a testing wire at a MPS test process as described above. However, The common voltage line for MPS (mass production system) 135 is used as a wire for distributing a common voltage to the common voltage line (not shown) after cutting the mother substrate into each the thin film transistor substrate 100. In other words, the common voltage (Vcom) from a voltage generating part is distributed to each the common voltage line (not shown) through the common voltage line for MPS (mass production system) 135.

The grounding line for MPS (mass production system) 145 is a wire for testing whether substrate area (a) (refer to FIG. 1) of the mother substrate is connected each other electrically or not. The grounding line for MPS (mass production system) 145 is employed for grounding the static electricity preventing circuit after cutting the mother substrate into each the thin film transistor substrate 100. The static electricity preventing circuit is floating with the grounding line for MPS (mass production system) 145.

The reason why the common voltage line for MPS (mass production system) 135 and the grounding line for MPS (mass production system) 145 are provided on the one side (lower side) in the edge of the non-display area (N) is that a space for providing the common voltage line for MPS (mass production system) 135 and the grounding line for MPS (mass production system) 145 in the other side is not enough because the gate driving chip 210, 220 and the data driving chip 230 is provided on the other side in the edge of the non-display area (N). Moreover, the reason why the common voltage line for MPS (mass production system) 135 and the grounding line for MPS (mass production system) 145 are provided on the one side (lower side) in the edge of the non-display area (N) is to reduce an interference between the common voltage line for MPS (mass production system) 135 or the grounding line for MPS (mass production system) 145 and the gate driving chip 210, 220 or the data driving chip 230.

The common voltage line for MPS (mass production system) 135 and the grounding line for MPS (mass production system) 145 are formed in a same material with the gate wire at the same time.

The following is a description for stack structure where the common voltage line for MPS (mass production system) 135 and the grounding line for MPS (mass production system) 145 are provided with referring to FIG. 3.

First, the common voltage line for MPS (mass production system) 135 and the grounding line for MPS (mass production system) 145 are provided on the one side (lower side) in the edge of the insulating substrate 110 in parallel. The common voltage line for MPS (mass production system) 135 and the grounding line for MPS (mass production system) 145 are formed on the same layer with the gate wire 125. The common voltage line for MPS (mass production system) 135, the grounding line for MPS (mass production system) 145 and the gate wire 125 are formed in a same material at the same time.

The insulating layer 140*b*, 180*b* is formed on the common voltage line for MPS (mass production system) 135 and the grounding line for MPS (mass production system) 145. The insulating layer 140*b*, 180*b* comprises the first insulating layer 140*b* including an inorganic material and the second insulating layer including an organic material. The first insulating layer 140*b* is formed in the same material with the gate insulating layer 140*a* as described above at the same time. The second insulating layer 180*b* is formed in the same material with the passivation layer 180*a* as described above at the same time. For example, the first insulating layer 140*b* and the gate insulating layer 140*a* comprise SiNx and SiO$_2$, and the second insulating layer 180*b* and the passivation layer 180*a* comprise acrylic polymer.

In the other hand, though not described in detail, the static electricity preventing circuit may be provided in a space between the first insulating layer 140*b* and the second insulating layer 180*b*, where it corresponds to the grounding line for MPS (mass production system) 145.

The electrode layer 191, 192 is provided on the insulating layer 140*b*, 180*b* corresponding to the common voltage line for MPS (mass production system) 135 and the grounding line for MPS (mass production system) 145. The electrode layer 191, 192 is formed in the same material with the pixel electrode 190 as described above at the same time. The electrode layer 191, 192 and the pixel electrode 190 comprise a transparent conductive material such as ITO (indium tin oxide) or IZO (indium zinc oxide).

The following is a description for the effect according to the present invention.

As shown in FIG. 3, the common voltage line for MPS (mass production system) 135, the insulating layer 140*b*, 180*b* and the electrode layer 191 forms the first capacitor C1 according to above structure. The grounding line for MPS (mass production system) 145, the insulating layer 140*b*, 180*b* and the electrode layer 192 forms the second capacitor C2 according to above structure. The first capacitor C1 and the second capacitor C2 are employed for charging the voltage of static electricity when static electricity is flowed into the display area (D). In other words, static electricity flowed is buffered or absorbed by the first capacitor C1 and the second capacitor C2, and the amount of static electricity is decreased or exhausted. Therefore, static electricity that flowed into the data wire 170 or the gate wire 125 of the display area (D) is minimized, thereby minimizing defects due to static electricity.

Figure 4A:
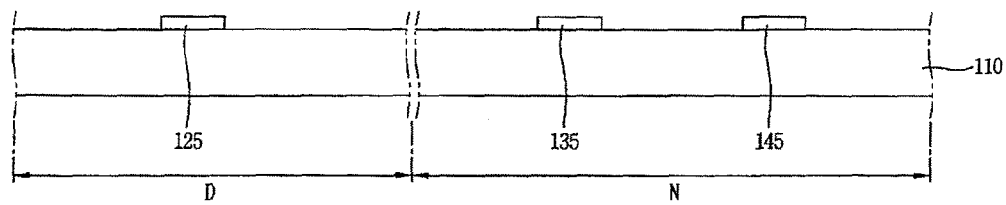
FIG. 4A through FIG. 4C are sectional views illustrating a fabricating method of the thin film transistor substrate in order according to the present invention.
Figure 4B:
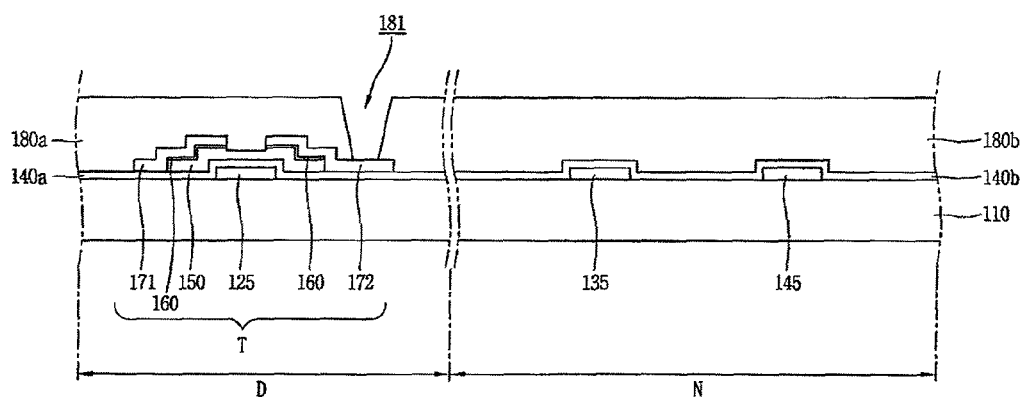
Figure 4C:
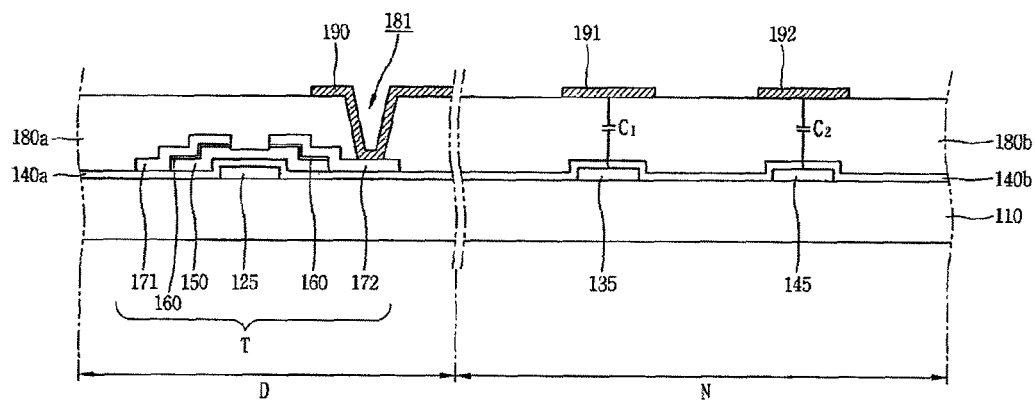

The Following is an illustration of a fabricating method of the thin film transistor substrate according to the present invention referring to FIG. 4*a* through FIG. 4*c*.

Features distinguished from the disclosed art may be described in the below description, and omitted or comprised description parts are same with the disclosed art.

The fabricating method of the thin film transistor substrate is shown on one side, and the fabricating method of area along III-III' of FIG. 2 is shown on the other side in FIG. 4A through FIG. 4C.

First, as shown in FIG. 4A, a metal layer is formed on the insulating substrate 110 uniformly. Afterwards, the metal layer is patterned to form the gate wire 125 on the display area (D), and the common voltage line for MPS (mass production system) 135 and the grounding line for MPS (mass production system) 145 on the non-display area (N). In other words, the common voltage line for MPS (mass production system) 135, the grounding line for MPS (mass production system) 145 and the gate wire 125 are formed in a same material at the same time. One part of the gate wire 125, a gate electrode, is comprised in the thin film transistor (TFT).

Thereafter, the inorganic material is applied to cover the gate wire 125, the common voltage line for MPS (mass production system) 135 and the grounding line for MPS (mass production system) 145. As shown in FIG. 4b, the inorganic material layer is patterned to form the gate insulating layer 140a and the first insulating layer 140b. The gate insulating layer 140a and the first insulating layer 140b are formed in the same material at the same time.

In the next time, as shown in FIG. 4B, the semiconductor layer 150, the ohmic contact layer 160, the source electrode 171 and the drain electrode 172 are formed on the display area (D) according to the disclosed art. Hence, the thin film transistor (T) as a switching device is completed. Afterwards, an organic material is applied to cover the thin film transistor (T) and the first insulating layer 140b. The organic material layer is patterned to form the passivation layer 180a and the second insulating layer 180b, and then the drain contact hole 181 is formed to expose the drain electrode 172. The passivation layer 180a and the second insulating layer 180b are formed in the same material at the same time.

Afterwards, as shown in FIG. 4C, the transparent conductive material such as ITO (indium tin oxide) or IZO (indium zinc oxide) is applied on the passivation layer 180a and the second insulating layer 180b uniformly, and then the pixel electrode 190 and the electrode layer 191, 192 are formed by patterning the transparent conductive material layer. The pixel electrode 190 is connected to the drain electrode 172 through the drain contact hole 181 electrically.

Hence, the first capacitor C1 is formed by the common voltage line for MPS (mass production system) 135, the insulating layer 140b, 180b and the electrode layer 191, and the second capacitor C2 is formed by the grounding line for MPS (mass production system) 145, the insulating layer 140b, 180b and the electrode layer 192.

The first capacitor C1 and the second capacitor C2 as above are employed for charging the voltage of static electricity when static electricity is flowed into the display area (D). Therefore, static electricity flowed is buffered or absorbed by the first capacitor C1 and the second capacitor C2, and the amount of static electricity is decreased or exhausted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fabricating method for a thin film transistor substrate for a liquid crystal display device to minimizing defects due to static electricity comprising:
    providing a thin film transistor substrate divided into a display area displaying the image and a non-display area besides the display area;
    forming a gate wire in the display area, a common voltage line for a MPS (mass production system) test in the non-display area, and a grounding line for the MPS test in the non-display area by patterning a metal layer;
    forming a gate insulating layer covering the gate wire and a first insulating layer covering the common voltage line for the MPS test and the grounding line for the MPS test with same material at the same time;
    forming a data wire crossing the gate wire and defining a pixel area in the display area; and
    forming a pixel electrode in the pixel area, a first electrode layer on the first insulating layer corresponding to the common voltage line for the MPS test and, a second electrode layer on the first insulating layer corresponding to the grounding line for the MPS test by patterning a transparent conductive material layer,
    wherein the common voltage line for the MPS test and the grounding line for the MPS test are formed in parallel in the non-display area at the edge of the thin film transistor substrate.

2. The fabricating method for a thin film transistor substrate according to claim 1, wherein the first and second electrode layers comprise ITO (indium tin oxide) or IZO (indium zinc oxide).

3. The fabricating method for a thin film transistor substrate according to claim 1, further comprising forming a passivation layer covering the data wire and a second insulating layer covering the first insulating layer in the non-display area with same material at the same time.

4. The fabricating method for a thin film transistor substrate according to claim 1, further comprising testing whether a common voltage is applied to a common line or not using the common voltage line for the MPS test.

5. The fabricating method for a thin film transistor substrate according to claim 4, wherein the common line in the display area is connected to the common voltage line for the MPS test.

6. The fabricating method for a thin film transistor substrate according to claim 5, wherein the common voltage line for the MPS test is used as a testing wire in a MPS test process and the common voltage line for the MPS test is used as a wire for distributing the common voltage to the common line after cutting a mother substrate into each thin film transistor substrate.

7. The fabricating method for a thin film transistor substrate according to claim 1, further comprising testing whether substrate areas of a mother substrate are connected to each other electrically or not using the grounding line for the MPS test.

* * * * *